(12) United States Patent
Tabata

(10) Patent No.: US 11,648,641 B2
(45) Date of Patent: May 16, 2023

(54) METHOD FOR POLISHING SILICON SUBSTRATE AND POLISHING COMPOSITION SET

(71) Applicant: FUJIMI INCORPORATED, Kiyosu (JP)

(72) Inventor: Makoto Tabata, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 806 days.

(21) Appl. No.: 16/080,659

(22) PCT Filed: Feb. 13, 2017

(86) PCT No.: PCT/JP2017/005139
§ 371 (c)(1),
(2) Date: Aug. 28, 2018

(87) PCT Pub. No.: WO2017/150157
PCT Pub. Date: Sep. 8, 2017

(65) Prior Publication Data
US 2019/0022821 A1    Jan. 24, 2019

(30) Foreign Application Priority Data
Feb. 29, 2016   (JP) .............................. JP2016-037247

(51) Int. Cl.
| | | |
|---|---|---|
| *B24B 37/11* | (2012.01) | |
| *B24B 37/00* | (2012.01) | |
| *H01L 21/02* | (2006.01) | |
| *C09G 1/02* | (2006.01) | |
| *H01L 21/304* | (2006.01) | |
| *B24B 37/08* | (2012.01) | |

(52) U.S. Cl.
CPC .............. *B24B 37/11* (2013.01); *B24B 37/00* (2013.01); *B24B 37/08* (2013.01); *C09G 1/02* (2013.01); *H01L 21/02013* (2013.01); *H01L 21/02024* (2013.01); *H01L 21/304* (2013.01)

(58) Field of Classification Search
None
See application file for complete search history.

(56) References Cited

U.S. PATENT DOCUMENTS

| | | |
|---|---|---|
| 5,860,848 A | 1/1999 | Loncki et al. |
| 6,060,396 A | 5/2000 | Fukami et al. |
| 2002/0004265 A1* | 1/2002 | Vepa .................. H01L 21/67219 438/200 |
| 2003/0022495 A1* | 1/2003 | Netsu ................ H01L 21/02024 438/689 |
| 2003/0060126 A1 | 3/2003 | Mikhaylich et al. |
| 2005/0205837 A1* | 9/2005 | Miwa .................... C09K 3/1463 252/79.1 |
| 2006/0264157 A1 | 11/2006 | Hashii et al. |
| 2007/0077764 A1 | 4/2007 | Shimizu |
| 2007/0193686 A1 | 8/2007 | Miyazaki et al. |
| 2009/0197412 A1 | 8/2009 | Nojo et al. |
| 2010/0009155 A1 | 1/2010 | Hashii et al. |
| 2011/0027997 A1 | 2/2011 | Shinoda et al. |
| 2011/0130073 A1 | 6/2011 | Furukawa et al. |
| 2012/0299158 A1 | 11/2012 | Shinoda et al. |
| 2013/0005219 A1 | 1/2013 | Takemura |
| 2014/0141613 A1 | 5/2014 | Heilmaier et al. |

FOREIGN PATENT DOCUMENTS

| | | |
|---|---|---|
| CN | 1939663 A | 4/2007 |
| CN | 102339742 A | 2/2012 |
| CN | 102473621 A | 5/2012 |
| CN | 102766409 A | 11/2012 |
| EP | 1 610 365 A1 | 12/2005 |
| JP | H11-186201 | 7/1999 |
| JP | H11-214338 | 8/1999 |
| JP | 2003-297775 | 10/2003 |
| JP | 2006-324417 A | 11/2006 |
| JP | 2007-150153 | 6/2007 |
| JP | 2010-021487 A | 1/2010 |
| JP | 2013-048291 A | 3/2013 |
| JP | 2014-103398 A | 6/2014 |

(Continued)

OTHER PUBLICATIONS

Office Action issued in corresponding European Application No. 17759628.5 dated Feb. 1, 2021.
Extended European Search Report issued on Application No. PCT/JP2017005139, dated Oct. 14, 2019.
Office Action issued in corresponding Taiwanese Application No. 106106214 dated Apr. 29, 2021.
Office Action of corresponding Chinese Patent Application No. 201780014069.1, dated Nov. 18, 2022.
Office Action issued in corresponding Korean Patent Application No. 10-2018-7019225, dated Feb. 27, 2023 (19 pages).

(Continued)

*Primary Examiner* — Stephanie P Duclair
(74) *Attorney, Agent, or Firm* — Foley & Lardner LLP

(57) ABSTRACT

Provided are a method for polishing a silicon substrate according to which PID can be reduced and a polishing composition set usable in the polishing method. The silicon substrate polishing method provided by this invention comprises a stock polishing step and a final polishing step. The stock polishing step comprises several stock polishing sub-steps carried out on one same platen. The several stock polishing sub-steps comprise a final stock polishing sub-step carried out while supplying a final stock polishing slurry $P_F$ to the silicon substrate. The total amount of the final stock polishing slurry $P_F$ supplied to the silicon substrate during the final stock polishing sub-step has a total weight of Cu and a total weight of Ni, at least one of which being 1 µg or less.

9 Claims, No Drawings

(56) References Cited

FOREIGN PATENT DOCUMENTS

| KR | 20060044389 A | 5/2006 |
|----|---------------|--------|
| KR | 20080005309 A | 1/2008 |
| TW | I499663 B | 9/2015 |
| WO | WO 2010/013390 A1 | 2/2010 |

OTHER PUBLICATIONS

Summons to Attend Oral Proceedings issued in corresponding European Patent Application No. 17759628.5, dated Mar. 24, 2023 (9 pages).

\* cited by examiner

METHOD FOR POLISHING SILICON SUBSTRATE AND POLISHING COMPOSITION SET

TECHNICAL FIELD

The present invention relates to a method for polishing a silicon substrate and a polishing composition set for use in polishing a silicon substrate. The present application claims priority to Japanese Patent Application No. 2016-37247 filed on Feb. 29, 2016; and the entire content thereof is herein incorporated by reference.

BACKGROUND ART

The surface of a silicon substrate used in manufacturing of a semiconductor product is generally polished to a high-quality mirror finish via a lapping step (rough polishing step) and a polishing step (fine polishing step). The polishing step typically includes a stock polishing step and a final polishing step. Technical literatures related to silicon wafer polishing include Patent Documents 1 to 3.

CITATION LIST

Patent Literature

[Patent Document 1] WO 2010/013390
[Patent Document 2] Japanese Patent Application Publication No. 2014-103398
[Patent Document 3] Japanese Patent Application Publication No. 2006-324417

SUMMARY OF INVENTION

Technical Problem

As semiconductor design rule is becoming finer, surfaces of silicon substrates are required to have higher-quality finishes. For instance, it is expected to further reduce micro defects induced by polishing processes, which are generally called PID (polishing induced defects).

An objective of the present invention is thus to provide a silicon substrate polishing method according to which PID can be reduced. Another related objective is to provide a polishing composition set that can be preferably used in such a polishing method.

Solution to Problem

It is generally thought that formation of micro defects such as PID is caused in a final polishing step or a later step carried out using a polishing slurry that is less abrasive as compared to the one used in a stock polishing step. A typical example of the less abrasive polishing slurry is a final polishing slurry comprising a water-soluble polymer such as hydroxyethyl cellulose. As for means to reduce PID, for instance, studies are underway on compositions of final polishing slurries used in final polishing steps.

On the other hand, the stock polishing step is generally thought as a step to prepare the shape of a silicon substrate and roughly condition of its surface prior to the final polishing step. In typical, as compared to the final polishing step, the stock polishing step generally uses a more removal polishing slurry to remove the surface of the silicon substrate, thereby efficiently reducing the surface roughness Ra, etc. Conventionally, it has been thought that what is done in the stock polishing step has little impact on micro defects in the outermost surface, such as PID after the final polishing step. For instance, in Patent Document 1, while the stock polishing is carried out on the same platen while switching polishing slurries, its purpose is to produce highly flat and smooth wafers with a high yield in a highly productive manner in a stock polishing step. In other words, Patent Document 1 is not aimed to reduce PID after the final polishing step. Likewise, neither Patent Document 2 nor 3 suggests an idea of carrying out the stock polishing step to reduce PID existing after the final polishing step. Under such circumstances, the present inventor has found that when the stock polishing step is suitably carried out, PID after the final polishing step can be efficiently reduced; whereby the present invention has been made.

The present application provides a method for polishing a silicon substrate. The method comprises a stock polishing step and a final polishing step. The stock polishing step includes several stock polishing sub-steps that are carried out on one same platen. The several stock polishing sub-steps include a final stock polishing sub-step that is carried out with supplying a final stock polishing slurry $P_F$ to the silicon substrate.

In an embodiment of the polishing method disclosed herein, the final stock polishing sub-step is carried out so that the total amount of the final stock polishing slurry $P_F$ supplied to the silicon substrate during the final stock polishing sub-step has a total weight of Cu and a total weight of Ni, at least one of which being 1 µg or less. By limiting at least either the total weight of Cu or the total weight of Ni in the final stock polishing slurry $P_F$ to or below the prescribed value, PID at the end of the final polishing step can be reduced. Thus, a silicon substrate having a high-quality surface with few PID can be appropriately produced.

In a preferable embodiment of the polishing method, in the final stock polishing sub-step, the sum of the total weight of Cu and the total weight of Ni in the total amount of the final stock polishing slurry $P_F$ supplied to the silicon substrate is 2 µg or less. According to such an embodiment, a silicon substrate with yet fewer PID at the end of the final polishing step can be obtained.

In another embodiment of the polishing method disclosed herein, the several stock polishing sub-steps include a final stock polishing sub-step that is carried out with supplying a final stock polishing slurry $P_F$ to the silicon substrate, and a non-final stock polishing sub-step that is carried out before the final stock polishing sub-step with supplying a non-final stock polishing slurry $P_N$ having a higher concentration of at least Cu or Ni than the concentration of the same element in the final stock polishing slurry $P_F$. In this manner, when, in the stock polishing step, the polishing is carried with the non-final stock polishing slurry $P_N$ and then further with the final stock polishing slurry $P_F$ with a lower Cu concentration and/or a lower Ni concentration, a silicon substrate with yet fewer PID at the end of the final polishing step can be obtained.

In a preferable embodiment of the polishing method disclosed herein, the non-final stock polishing slurry $P_N$ has a weight of at least Cu or Ni per 10 g of abrasive contained therein greater than the weight of the same element per 10 g of abrasive contained in the final stock polishing slurry $P_F$. According to such an embodiment, a silicon substrate with yet fewer PID at the end of the final polishing step can be obtained.

In another preferable embodiment of the polishing method disclosed herein, the final stock polishing slurry $P_F$ has a weight of at least Cu or Ni of 0.02 µg or less per 10 g of abrasive contained in the final stock polishing slurry $P_F$. According to such an embodiment, a silicon substrate with yet fewer PID after the final polishing step can be obtained.

In another preferable embodiment of the polishing method disclosed herein, the final stock polishing slurry $P_F$ has a combined weight of Cu and Ni of 0.1 μg or less per 10 g of abrasive contained in the final stock polishing slurry $P_F$. According to such an embodiment, a silicon substrate with yet fewer PID after the final polishing step can be obtained.

In a preferable embodiment of the polishing method disclosed herein, the non-final stock polishing slurry $P_N$ has a combined weight of Cu and Ni per 10 g of abrasive contained therein greater than the combined weight of Cu and Ni per 10 g of the abrasive contained in the final stock polishing slurry $P_F$. According to such an embodiment, while considerations are given to productivity and cost-effectiveness of the stock polishing step, a silicon substrate with yet fewer PID after the final polishing step can be obtained.

The polishing method disclosed herein can be preferably carried out in an embodiment where both sides of the silicon substrate are polished simultaneously in the stock polishing step and one side of the silicon substrate is polished in the final polishing step. According to such an embodiment, a silicon substrate with yet fewer PID after the final polishing step can be productively obtained.

Silicon substrates may be irradiated on the surface by laser light so that, for purposes including identification, they are provided with marks such as barcodes, numbers and symbols, which are generally called hard laser marks. Hereinafter, hard laser mark(s) may be indicated by "HLM." HLM is generally provided after a silicon substrate is subjected to a lapping step and before a polishing step is started. In typical, laser irradiation to provide HLM causes bumps around peripheries of the HLM in the surface of the silicon substrate. The HLM area in the silicon substrate is not used in a final product. However, once the HLM is provided, unless the bumps are properly cancelled in the polishing step, the yield may unacceptably decrease. Thus, it is desirable to properly cancel bumps of the HLM peripheries in a stock polishing step.

The polishing method disclosed herein can also be preferably carried out in an embodiment where a HLM-bearing silicon substrate is subjected to the stock polishing step. This can effectively cancel bumps of the HLM peripheries and bring about a silicon substrate with fewer PID at the end of the final polishing step.

As used herein, cancelling a bump of a HLM periphery means decreasing the height from the reference surface (flat surface for reference) around the HLM to the highest point of the bump in the silicon substrate. The height from the reference surface to the highest point of the bump can be determined by, for instance, the method described later in Examples. Hereinafter, the ability to cancel bumps of HLM peripheries may be referred to as "bump-cancellation abilities."

The present invention also provides a polishing composition set used in a polishing method disclosed herein. The polishing composition set comprises the non-final stock polishing slurry $P_N$ or a non-final stock polishing composition $Q_N$ which is a concentrate of $P_N$. The polishing composition set preferably further comprises the final stock polishing slurry $P_F$ or a final stock polishing composition $Q_F$ which is a concentrate of $P_F$. Here, the non-final stock polishing composition $Q_N$ and the final stock polishing composition $Q_F$ are separately stored. The polishing method disclosed herein can be favorably practiced, using a polishing composition set having such a make-up.

Matters disclosed by the present application includes a polishing composition used as a final stock polishing slurry $P_F$ in a polishing method disclosed herein, wherein the polishing composition has a weight of at least Cu or Ni of 0.02 μg or less per 10 g of abrasive contained therein. The polishing method disclosed herein can be favorably practiced, using such a polishing composition.

Matters disclosed by the present application includes a polishing composition used as the final stock polishing slurry $P_F$ in a polishing method disclosed herein, wherein the polishing composition has a combined weight of Cu and Ni of 0.1 μg or less per 10 g of abrasive contained therein. The polishing method disclosed herein can be favorably practiced, using such a polishing composition.

DESCRIPTION OF EMBODIMENTS

Preferred embodiments of the present invention are described below. Matters necessary to implement this invention other than those specifically referred to in this description may be understood as design matters to a person of ordinary skill in the art based on the conventional art in the pertinent field. The present invention can be implemented based on the contents disclosed in this description and common technical knowledge in the subject field.

The art disclosed herein can be preferably applied to a polishing process whose polishing object is a silicon substrate. In particular, it is favorable in a polishing process whose polishing object is a silicon wafer. A typical example of the silicon wafer here is a monocrystalline silicon wafer, for instance, a slice of monocrystalline silicon ingot. In the art disclosed herein, the polishing surface (surface to be polished) is typically formed from silicon.

Before the stock polishing step disclosed herein, the silicon substrate may be subjected to a general treatment that can be applied to a silicon substrate in an earlier step than the stock polishing step, such as lapping, etching and HLM processing.

In the following, regardless of which stock polishing sub-step uses the polishing slurry of interest, for instance, regardless whether it is a final stock polishing slurry or a non-final stock polishing slurry, the term "stock polishing slurry" may be used, referring to stock polishing slurry in general that is used in a stock polishing step. Similarly, regardless of which polishing step uses the polishing slurry of interest, for instance, regardless whether it is used in the stock polishing step or in a final polishing step, the term "polishing slurry" may be used, referring to a polishing slurry in general that is used in a polishing step.

<Stock Polishing Step>

The stock polishing step in the polishing method disclosed herein includes several stock polishing sub-steps that are carried out on one same platen (or polishing platen). In other words, the several stock polishing sub-steps are carried out without moving the polishing object to a different polishing machine or onto a different platen in the middle of the step. Thus, the several stock polishing sub-steps can be efficiently carried out while preventing the stock polishing step from requiring a longer time or more complicated work. The several stock polishing sub-steps are carried out with respect to one polishing object, sub-step by sub-step (i.e. sequentially). It is noted, however, that in each stock polishing sub-step, it is allowed to polish several polishing objects simultaneously or in parallel, that is, to carry out batch-polishing.

Each stock polishing sub-step is carried out while supplying a stock polishing slurry to the polishing object. The stock polishing slurry used in each stock polishing sub-step typically comprises an abrasive and water. The stock polishing slurries used in the respective stock polishing sub-steps may have the same or different compositions. The components of the stock polishing slurry are described below.

(Abrasive)

The material and properties of the abrasive in the stock polishing slurry used in the art disclosed herein are not particularly limited and can be suitably selected in accordance with its purpose and application. For the abrasive, solely one species or a combination of two or more species can be used. Examples of the abrasive include inorganic particles, organic particles and organic/inorganic composite particles. Specific examples of inorganic particles include silicon compound particles such as silica particles, silicon nitride particles and silicon carbide particles as well as diamond particles. Specific examples of organic particles include poly(methyl methacrylate) (PMMA) particles and polyacrylonitrile particles. In particular, inorganic particles are preferable.

In the art disclosed herein, particularly preferable abrasives include silica particles. The art disclosed herein can be preferably practiced, for instance, in an embodiment where the abrasive is substantially formed of silica particles. The term "substantially" is used here to indicate that the silica particles account for 95% by weight or more (preferably 98% by weight or more, more preferably 99% by weight or more, or possibly 100% by weight) of the particles forming the abrasive.

Specific examples of silica particles include colloidal silica, fumed silica and precipitated silica. For the silica particles, solely one species or a combination of two or more species can be used. Colloidal silica is particularly preferable as it is less likely to cause scratches on the surface of the polishing object while it can exhibit great polishing abilities (an ability to reduce surface roughness, bump-cancellation abilities, etc.). As the colloidal silica, for instance, colloidal silica prepared by ion exchange of liquid glass (sodium silicate) as the starting material and alkoxide-based colloidal silica can be preferably used. Here, the alkoxide-based colloidal silica refers to colloidal silica produced by hydrolysis and condensation reactions of an alkoxysilane. For the colloidal silica, solely one species or a combination of two or more species can be used.

The silica forming the silica particles has a true specific gravity of preferably 1.5 or higher, more preferably 1.6 or higher, or yet more preferably 1.7 or higher. With increasing true specific gravity of the silica, the polishing removal rate tends to increase. From such a standpoint, preferable silica particles have a true specific gravity of 2.0 or higher (e.g. 2.1 or higher). The maximum true specific gravity of the silica is not particularly limited. It is typically 2.3 or lower, for instance, 2.2 or lower. As the true specific gravity of the silica, the value measured by a liquid displacement method using ethanol as the displacing liquid can be used.

The BET diameter of the abrasives (typically silica particles) in the stock polishing slurry is not particularly limited. From the standpoint of the efficiency of polishing, etc., the BET diameter is preferably 5 nm or greater, more preferably 10 nm or greater, or particularly preferably 20 nm or greater. From the standpoint of obtaining greater polishing effect (e.g. reduction of surface roughness, bump-cancellation abilities, etc.), it is preferable to use an abrasive having a BET diameter of 25 nm or greater, or even 30 nm or greater (e.g. 32 nm or greater). From the standpoint of preventing scratches, etc., the BET diameter of the abrasive is preferably 100 nm or less, more preferably 80 nm or less, or yet more preferably 70 nm or less. In an embodiment, the BET diameter of the abrasive can be 60 nm or less (e.g. 55 nm or less).

As used herein, the BET diameter refers to the particle diameter determined from the specific surface area (BET value) which is measured by a BET method, according to the next equation: BET diameter $(nm)=6000/$(true density $(g/cm^3) \times$BET value $(m^2/g))$. For instance, with respect to silica grains, the BET diameter can be determined by BET diameter $(nm)=2727/$BET value $(m^2/g)$. The specific surface area can be determined using, for instance, a specific surface area analyzer under trade name Flow Sorb II 2300 available from Micromeritics.

The shape (outer shape) of the abrasives may be a globular shape or a non-globular shape. Specific examples of non-globular shapes of the abrasive include a peanut shape (i.e. peanut shell shape), cocoon shape, conpeito shape (spiky ball shape), rugby ball shape, and so on. For instance, the abrasive mostly comprising peanut-shaped particles can be preferably used.

While no particular limitations are imposed, the average value of major axis/minor axis (i.e. average aspect ratio) of the abrasives is theoretically 1.0 or higher, more preferably 1.05 or higher, or yet more preferably 1.1 or higher. With increasing the average aspect ratio, greater bump-cancellation abilities can be obtained. From the standpoint of scratch reduction and so on, the average aspect ratio of the abrasives is preferably 3.0 or lower, more preferably 2.0 or lower, or yet more preferably 1.5 or lower.

The shape (outer shape) and the average aspect ratio of the abrasive can be determined, for instance, by electron microscopy observation. In particular, the average aspect ratio is determined, for instance, by the following procedure: By scanning electron microscopy (SEM), with respect to a prescribed number (e.g. 200) of silica particles whose shapes can be separately recognized, the smallest rectangle is drawn to circumscribe each particle image. With respect to the rectangle drawn for each particle image, the long side (major axis) is divided by the short side (minor axis) to determine the major axis/minor axis ratio (aspect ratio). The aspect ratios of the prescribed number of particles can be arithmetically averaged to determine the average aspect ratio.

The content of the abrasives in the stock polishing slurry is not particularly limited. In an embodiment, the content of the abrasive is preferably 0.05% by weight or higher, more preferably 0.1% by weight or higher, or yet more preferably 0.3% by weight or higher, for instance, 0.5% by weight or higher. With increasing the content of the abrasive, a higher polishing removal rate can be obtained. From the standpoint of the ease of removal from polishing objects, etc., the content of the abrasive is usually suitably 10% by weight or lower, preferably 7% by weight or lower, more preferably 5% by weight or lower, or yet more preferably 3% by weight or lower, for instance, 2% by weight or lower.

(Water)

The stock polishing slurry typically includes water. As the water in the polishing composition disclosed herein, ion-exchanged water (deionized water), pure water, ultrapure water, distilled water and the like can be preferably used. To avoid hindering the effect of other components in the stock polishing slurry whenever possible, the water to be used preferably includes a total of, for instance, 100 ppb transition metal ion(s) or less. For example, the purity of the water can be increased by operations such as removing impurity ions with ion-exchange resin, removing contaminants with a filter, distillation, and so on.

(Basic Compound)

The stock polishing slurry preferably includes a basic compound. As used herein, the basic compound refers to a compound that is soluble in water and capable of increasing a pH of an aqueous solution. As the basic compound, organic or inorganic nitrogen-containing basic compounds, hydroxides of alkali metals, hydroxides of alkaline earth metals, various carbonates, hydrogen carbonates and the like can be used. Examples of the nitrogen-containing basic compounds include quaternary ammonium compounds, quaternary phosphonium compounds, ammonia, and amines (preferably water-soluble amines). These basic compounds can be used solely as one species or in a combination of two or more species.

Specific examples of the alkali metal hydroxides include potassium hydroxide and sodium hydroxide. Specific examples of the carbonates and the hydrogencarbonates include ammonium hydrogencarbonate, ammonium carbonate, potassium hydrogencarbonate, potassium carbonate, sodium hydrogencarbonate, and sodium carbonate. Specific examples of the amines include methylamine, dimethylamine, trimethylamine, ethylamine, diethylamine, triethylamine, ethylenediamine, monoethanolamine, N-(β-aminoethy-Dethanolamine, hexamethylenediamine, diethylenetriamine, triethylenetetraamine, anhydrous piperazine, piperazine hexahydrate, 1-(2-aminoethyl)piperazine, N-methylpiperazine, guanidine, and azoles such as imidazole and triazole. Specific examples of the quaternary phosphonium compounds include quaternary phosphonium hydroxides such as tetramethylphosphonium hydroxide and tetraethylphosphonium hydroxide.

Preferable quaternary ammonium compounds include quaternary ammonium salts (typically strong salts) such as tetraalkyl ammonium salts and hydroxyalkyl trialkyl ammonium salts. Anions in such quaternary ammonium salts can be, for instance, $OH^-$, $F^-$, $Cl^-$, $Br^-$, $I^-$, $ClO_4^-$ and $BH_4^-$. A particularly preferable example is a quaternary ammonium salt whose anion is $OH^-$, that is, a quaternary ammonium hydroxide. Specific examples of the quaternary ammonium hydroxides include tetraalkylammonium hydroxides such as tetramethylammonium hydroxide, tetraethylammonium hydroxide, tetrapropylammonium hydroxide, tetrabutylammonium hydroxide, tetrapentylammonium hydroxide and tetrahexylammonium hydroxide; and hydroxyalkyltrialkylammonium hydroxides such as 2-hydroxyethyltrimethylammonium hydroxide (or choline). Among these, the tetraalkylammonium hydroxides are preferable. In particular, tetramethylammonium hydroxide (TMAH) is preferable.

The stock polishing slurry may comprise a quaternary ammonium compound (e.g. a tetraalkylammonium hydroxide such as TMAH) as described above in combination with a weak acid salt. As the weak acid salt, an acid that is usable in polishing by using silica particles and is able to provide desirable buffering ability when combined with the quaternary ammonium compound can be suitably selected. As the weak acid salt, solely one species or a combination of two or more species can be used. Specific examples of the weak acid salt include sodium carbonate, potassium carbonate, sodium bicarbonate, potassium bicarbonate, sodium orthosilicate, potassium orthosilicate, sodium acetate, potassium acetate, sodium propionate, potassium propionate, calcium carbonate, calcium bicarbonate, calcium acetate, calcium propionate, magnesium acetate, magnesium propionate, zinc propionate, manganese acetate, and cobalt acetate. A weak acid salt whose anion is a carbonate or bicarbonate is preferable. A weak acid salt whose anion is a carbonate is particularly preferable. Favorable cations include alkali metal ions such as potassium and sodium ions. Particularly preferable weak acid salts include sodium carbonate, potassium carbonate, sodium bicarbonate and potassium bicarbonate. In particular, potassium carbonate ($K_2CO_3$) is preferable.

(Chelating Agent)

The stock polishing slurry can include a chelating agent as an optional component. The chelating agent forms a complex ion with a metal impurity which may be contained in the stock polishing slurry to trap this, thereby reducing contamination of the polishing object caused by the metal impurity. Examples of the chelating agent include aminocarboxylic acid-based chelating agents and organophosphonic acid-based chelating agents. Examples of the aminocarboxylic acid-based chelating agents include ethylenediamine tetraacetic acid, ethylenediamine tetraacetic acid sodium salt, nitrilotriacetic acid, nitrilotriacetic acid sodium salt, nitrilotriacetic acid ammonium salt, hydroxyethylethylenedimaine triacetic acid, hydroxyethylethylenediamine triacetic acid sodium salt, diethylenetriamine pentaacetic acid, diethylenetriamine pentaacetic acid sodium salt, triethylenetetramine hexaacetic acid, and triethylenetetramine hexaacetic acid sodium salt. Examples of the organophosphonic acid-based chelating agents include 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1, 1-diphosphonic acid, ethane-1-hydroxy-1,1,2-triphosphonic acid, ethane-1,2-dicarboxy-1,2-diphosphonic acid, methanehydroxyphosphonic acid, 2- phosphonobutane-1,2-dicarboxylic acid, 1-phosphonobutane-2,3,4-tricarboxylic acid, and α-methylphosphonosuccinic acid. Among them, organophosphonic acid-based chelating agents are preferable. More preferable examples include ethylenediaminetetrakis(methylenephosphonic acid) and diethylenetriaminepenta(methylenephosphonic acid) and diethylenetriaminepentaacetic acid. Particularly preferable chelating agents include ethylenediaminetetrakis(methylenephosphonic acid) and diethylene triamine penta(methylene phosphonic acid). For the chelating agent, solely one species or a combination of two or more species can be used.

(Other Components)

As long as the effect of the present invention is not impaired, the stock polishing slurry may further include, as necessary, known additives that can be used in polishing slurries (typically those used in polishing steps of silicon substrates), such as water-soluble polymer, surfactant, organic acid, organic acid salt, inorganic acid, inorganic acid salt, antiseptic agent, and anti-fungal agent.

The stock polishing slurry is preferably substantially free of oxidant. This is because when the stock polishing slurry containing an oxidant is supplied to a polishing object (a silicon substrate here), the surface of the polishing object may be oxidized to form an oxide layer, thereby decreasing the polishing removal rate. Specific examples of the oxidant include hydrogen peroxide ($H_2O_2$), sodium persulfate, ammonium persulfate, and sodium dichloroisocyanurate.

The stock polishing slurry being substantially free of oxidant means that no oxidant has been intentionally allowed to be included.

(pH)

The stock polishing slurry has a pH of typically 8.0 or higher, preferably 8.5 or higher, more preferably 9.0 or higher, or yet more preferably 9.5 or higher, for instance, 10.0 or higher. With increasing the pH of the stock polishing slurry, the polishing removal rate and bump-cancellation abilities tend to be enhanced. On the other hand, from the standpoint of preventing dissolution of the abrasive (e.g. silica particles) and reducing weakening of mechanical polishing effect of the abrasive, the pH of the stock polishing slurry is suitably 12.0 or lower, preferably 11.8 or lower, more preferably 11.5 or lower, or yet more preferably 11.0 or lower. A similar pH value can be preferably used in a final polishing slurry described later.

In the art disclosed herein, a pH of a liquid composition (possibly polishing slurry, a concentrate thereof, a rinse solution described later) can be obtained as follows: Using a pH meter and standard buffer solutions (a phthalate pH buffer solution at pH 4.01 (25° C.), a neutral phosphate pH buffer solution at pH 6.86 (25° C.), and a carbonate pH buffer solution at pH 10.01 (25° C.)), after three-point correction, a glass electrode is immersed in the polishing liquid; and the stabilized value after two minutes or more is measured. As the pH meter, a glass electrode proton concentration meter (model number F-23) available from Horiba, Ltd., or a comparable product is used.

(Final Stock Polishing Sub-Step)

Of the several stock polishing sub-steps, the stock polishing sub-step performed at last, that is, the final stock polishing sub-step, is carried out with supplying the final stock polishing slurry $P_F$ to the polishing object. In an embodiment of the polishing method disclosed herein, the final stock polishing sub-step is implemented so that the total amount of the final stock polishing slurry $P_F$ supplied to the silicon substrate during the final stock polishing sub-step has a total weight of at least Cu (copper) or Ni (nickel) of 1 µg or less. This can effectively reduce PID in the silicon substrate obtained via the subsequent final polishing step. Hereinafter, the total weight of Cu in the total amount of the final stock polishing slurry $P_F$ may be represented by $W_{FCu}$ and the total weight of Ni in the total amount of the final stock polishing slurry $P_F$ by $W_{FNi}$.

While no theoretical limitations are intended, when the quantities ($W_{FCu}$ and $W_{FNi}$) of Cu and Ni supplied to the polishing object in the final stock polishing sub-step are limited as described above, PID upon final polishing may be reduced because of the following reasons:

When the polishing slurry supplied to the silicon substrate includes Cu and Ni, in an area where they have touched, the surface of the silicon substrate may be locally oxidized to form $SiO_2$. Here, a stock polishing step generally uses a stock polishing slurry that shows a high polishing removal rate and powerful mechanical polishing effect (effect to mechanically remove the surface of the silicon substrate) as compared to a final polishing slurry. Thus, it is thought that, during polishing with the stock polishing slurry, local formation of $SiO_2$ on the silicon substrate caused by the Cu and Ni in the stock polishing slurry takes place in parallel while the silicon sub-surface including the local $SiO_2$ is being removed by the abrasive power of the stock polishing slurry. On the other hand, from the standpoint of reducing haze and preventing scratches, the final polishing step uses a final polishing slurry that shows weaker mechanical polishing effect. In addition, polishing slurry for polishing silicon substrates is prepared to be suited to polishing silicon (typically monocrystalline Si); and therefore, it shows a significantly lower polishing removal rate with $SiO_2$ than with Si. Thus, it is thought that, when $SiO_2$ is present locally in an area of the silicon sub-surface at the end of the polishing with the stock polishing slurry (i.e. at the end of the last stock polishing sub-step), the amount (depth) of the surface removed in this area during the final polishing step is relatively smaller than its surroundings with Si; as a result, the area is detected as PID (a bump defect induced by a polishing process).

The inclusion of chelating agent in polishing slurry is known to prevent contamination of silicon wafers by metal impurities present in the polishing slurry. However, the conventional art of simply adding chelating agent to prevent metal contamination cannot effectively inhibit the local formation of $SiO_2$ and PID arising from this.

Presumably, according to the art disclosed herein, with the limited amount of Cu and/or Ni supplied to the polishing object in the final stock polishing sub-step, the amount of local $SiO_2$ present on the silicon sub-surface at the end of the final stock polishing sub-step is reduced; this prevents formation of bulge defects arising from the local $SiO_2$, whereby PID upon final polishing is effectively reduced. The same mechanism may be involved in reduction of PID achieved by controlling the concentrations of Cu and/or Ni in the final stock polishing slurry $P_F$ or their weight ratio relative to the abrasive. Because the stock polishing step includes several stock polishing sub-steps, a high degree of freedom is allowed in designing a stock polishing sub-step carried out before the final stock polishing sub-step, that is, a non-final polishing sub-step (e.g. in selecting the composition of polishing slurry used and setting the polishing time, etc.). Thus, PID can be reduced while lessening the impact on the productivity and cost-effectiveness.

According to an embodiment of the polishing method disclosed herein, by carrying out the final stock polishing sub-step so that at least $W_{FCu}$ or $W_{FNi}$ is 1 µg or less (preferably 0.6 µg or less, more preferably 0.3 µg or less, e.g. 0.1 µg or less), a silicon substrate with fewer PID at the end of the final polishing step can be obtained. The polishing method can be preferably practiced in an embodiment where at least $W_{FCu}$ is at or below this value. The polishing method can be preferably practiced in an embodiment where at least $W_{FNi}$ is at or below this value.

In the polishing method disclosed herein, the combined amount of $W_{FCu}$ and $W_{FNi}$ ($W_{FCu}+W_{FNi}$) is not particularly limited. It is usually suitably 3 µg or less. The polishing method disclosed herein can be implemented in an embodiment where $W_{FCu}-W_{FNi}$ is preferably 2 µg or less, more preferably 1 µg or less, or yet more preferably 0.4 µg or less, for instance, 0.2 µg or less. According to such an embodiment, the effect to reduce PID can be obtained more consistently. From the standpoint of reducing PID, the smaller the $W_{FCu}+W_{FNi}$ value is, the greater the effect is; or it can be below the detection limit From the standpoint of the cost-effectiveness, productivity, etc., the polishing method disclosed herein can also be practiced in an embodiment where $W_{FCu}+W_{FNi}$ is, for instance, 0.005 µg or greater; and can also provide significant PID-reducing effect in such an embodiment.

The polishing method disclosed herein can be preferably implemented in an embodiment where each of $W_{FCu}$ and $W_{FNi}$ is 1 µg or less, preferably 0.6 µg or less, or more preferably 0.3 µg or less, for instance, 0.1 µg or less. When the final stock polishing sub-step is carried out so that both $W_{FCu}$ and $W_{FNi}$ are at or below these values, a silicon substrate with yet fewer PID at the end of the finishing step can be obtained.

There are no particular limitations to the concentration of Cu or Ni in the final stock polishing slurry $P_F$. In a preferable embodiment, at least the Cu concentration or the Ni concentration is 0.3 ppb or lower in the final stock polishing slurry $P_F$. In other words, the weight of Cu in 1 liter (L) of the final stock polishing slurry $P_F$ is 0.3 µg or less. In a more preferable final stock polishing slurry $P_F$, at least the Cu concentration or the Ni concentration is 0.1 ppb or lower (more preferably 0.05 ppb or lower, e.g. 0.01 ppb or lower). Such a final stock polishing slurry $P_F$ may show greater PID-reducing effect.

The combined concentration of Cu and Ni (or a Cu/i combined concentration, hereinafter) in the final stock polishing slurry $P_F$ is, for instance, 1 ppb or lower, preferably 0.5 ppb or lower, more preferably 03 pph or lower, yet more preferably 0.1 pph or lower, or particularly preferably 0.03 ppb or lower, for instance, 0.02 ppb or lower. A final stock polishing slurry $P_F$ having a lower Cu/Ni combined concentration may exhibit greater PID-reducing effect. The smaller the Cu/Ni combined concentration is, the greater the effect is; or it can be below the detection limit. From the standpoint of the cost-effectiveness, productivity, etc., the polishing method disclosed herein can also be practiced in an embodiment where the Cu Ni combined concentration is, for instance, 0.001 ppb or higher; and can also provide significant PID-reducing effect in such an embodiment.

The polishing method disclosed herein can be preferably implemented in an embodiment where each of the Cu and Ni concentrations in the final stock polishing slurry $P_F$ is preferably 0.3 ppb or lower, more preferably 0.1 ppb or lower, or yet more preferably 0.05 ppb or lower, for instance, 0.01 ppb or lower. Such a final stock polishing slurry $P_F$ may show greater PID-reducing effect.

In a preferable embodiment, in the final stock polishing slurry $P_F$, at least the weight of Cu or the weight of Ni per 10 g of abrasive contained therein is preferably 0.3 µg or less, more preferably 0.1 µg or less, yet more preferably 0.02 µg or less, or particularly preferably 0.01 µg or less, for instance, 0.007 µg or less. Greater PID-reducing effect can be obtained with a final stock polishing slurry $P_F$ in which at least the weight of Cu or the weight of Ni per 10 g of abrasive is yet smaller.

The combined weight of Cu and Ni in the final stock polishing slurry $P_F$ is, per 10 g of abrasive contained therein, preferably 0.5 µg or less, more preferably 0.1 µg or less, yet more preferably 0.05 µg or less, or particularly preferably 0.02 µg or less, for instance, 0.01 µg or less. Greater PID-reducing effect may be obtained with a final stock polishing slurry $P_F$ having a smaller combined weight of Cu and Ni per 10 g of abrasive.

The polishing method disclosed herein can be preferably practiced in an embodiment where each of the weight of Cu and the weight of Ni per 10 g of abrasive in the final stock polishing slurry $P_F$ is 0.3 µg or less, more preferably 0.1 µg or less, yet more preferably 0.02 µg or less, or particularly preferably 0.01 µg or less, for instance, 0.007 µg or less. Such a final stock polishing slurry $P_F$ may show greater PID-reducing effect.

In the present application, amounts of Cu and Ni contained in a composition (e.g. polishing slurry, a concentrate of polishing slurry, a rinse solution, etc.) or in a material (e.g. abrasive, water, etc.) can be obtained by inductively coupled plasma mass spectrometry (ICP-MS). In the analysis, non-volatiles such as abrasive grains are dissolved by a typical method (e.g. by using hydrofluoric acid and the like for silica particles). For instance, when a concentrate (e.g. with about 10% to 50% abrasive by weight) is diluted with water substantially free of ions to prepare a polishing slurry, the concentrations of Cu and Ni in the polishing slurry can be determined from analytical values of the concentrate and the dilution factor.

$W_{FCu}$, the total weight of Cu in the total amount of the final stock polishing slurry $P_F$ supplied to the silicon substrate in the final stock polishing sub-step, can be determined from the Cu concentration of the final stock polishing slurry $P_F$, the flow rate and the supply time (i.e. the polishing time in the final stock polishing sub-step). The same applies to $W_{FNi}$, the total weight of Ni in the total amount of the final stock polishing slurry $P_F$ supplied to the silicon substrate in the final stock polishing sub-step. For instance, when the final stock polishing sub-step is carried out for three minutes while supplying a final stock polishing slurry $P_F$ containing 0.005 ppb Cu and 0.005 ppb Ni at a flow rate of 4 L/min, $W_{FCu}$ is determined to be 0.06 µg, $W_{FNi}$ 0.06 µg, and $W_{FCu}+W_{FNi}$ 0.012 µg.

In the art disclosed herein, $W_{FCu}$, $W_{FNi}$, and $W_{FCu}+W_{FNi}$ can be adjusted through the Cu and Ni concentrations, flow rate, supply time and so on of the final stock polishing slurry $P_F$. The Cu and Ni concentrations of the final stock polishing slurry $P_F$ can be adjusted, for instance, through types of materials (e.g. abrasive) used and selection of production method used in producing or preparing the final stock polishing slurry $P_F$.

When the final stock polishing slurry $P_F$ is used in recycle, $W_{FCu}$, $W_{FNi}$, and $W_{FCu}+W_{FNi}$ are determined based on the gross amount of the final stock polishing slurry $P_F$ supplied during the final stock polishing sub-step (i.e. based on the product of flow rate and supply time, similarly to a case where it is used in one-way). This is because, presumably, most of Cu and Ni in the final stock polishing slurry $P_F$ supplied to the polishing object during the recycling use is collected along with the final stock polishing slurry $P_F$ and supplied again to the polishing object.

While no particular limitations are imposed, the polishing time for the final stock polishing sub-step (i.e. the time of polishing while supplying the final stock polishing slurry $P_F$ to the polishing object) can be, for instance, 30 minutes or less. From the standpoint of the productivity, it is preferably 15 minutes or less, more preferably 10 minutes or less, or yet more preferably 7 minutes or less. The polishing time can also be 5 minutes or less, or even 4 minutes or less. On the other hand, from the standpoint of suitably polishing off local $SiO_2$ that may be present at the beginning of the final stock polishing sub-step, the polishing time of the final stock polishing sub-step is typically suitably 30 seconds or more, or preferably 1 minute or more. From the standpoint of obtaining greater effect, the polishing time can also be 1.5 minutes or more, or even 2 minutes or more.

(Non-Final Stock Polishing Sub-Step)

The polishing method disclosed herein may include, prior to the final stock polishing sub-step, a non-final stock polishing sub-step carried out by supplying a silicon substrate with a non-final stock polishing slurry $P_N$ that has a higher concentration of at least Cu or Ni than that of the same element in the final stock polishing slurry $P_F$. In such a manner, by polishing with the non-final stock polishing slurry $P_N$ followed by polishing with the final stock polishing slurry $P_F$ wherein at least its Cu concentration or Ni concentration is lower than that of the same element in the non-final stock polishing slurry $P_N$, the number of local $SiO_2$ possibly present on the silicon sub-surface at the end of the final stock polishing sub-step can be effectively reduced. By further subjecting such a silicon substrate to a final polishing step, a silicon substrate with fewer PID can be efficiently obtained.

While no particular limitations are imposed, at least the Cu concentration or the Ni concentration of the non-final stock polishing slurry $P_N$ can be, for instance, 1.2 times or higher, 1.5 times or higher, 2 times or higher, or even 5 times or higher than the concentration of the same element in the final stock polishing slurry $P_F$. According to the art disclosed herein, PID upon final polishing can be effectively reduced even with the use of the non-final stock polishing slurry $P_N$ in which the concentrations of Cu and Ni are mildly limited as compared to those in the final stock polishing slurry $P_F$. This is preferable from the standpoint of the productivity and cost-effectiveness of manufacturing silicon substrates.

For instance, in an embodiment where the stock polishing step includes several non-final stock polishing sub-steps that use several different non-final stock polishing slurries $P_N$ varying in Cu concentration, the Cu concentration of the final stock polishing slurry $P_F$ is compared to the Cu concentration of the non-final stock polishing slurry $P_N$ having the highest Cu concentration among them. The same applies to the Ni concentration and the Cu/Ni combined concentration.

In a preferable embodiment, it is possible to use a non-final stock polishing slurry $P_N$ having a higher Cu/Ni combined concentration than that of the final stock polishing slurry $P_F$. In relation to the Cu/Ni combined concentration of the final stock polishing slurry $P_F$, the Cu/Ni combined concentration in the non-final stock polishing slurry $P_N$ can be, for instance, 1.2 times or higher, 1.5 times or higher, 2 times or higher, or even 5 times or higher. The polishing method disclosed herein can also be practiced in an embodiment using such a non-final stock polishing slurry $P_N$ and can reduce PID at the end of final polishing. From the standpoint of preventing metal contamination of the silicon substrate, the Cu/Ni combined concentration in the non-final stock polishing slurry $P_N$ is preferably 10 ppb or lower, or more preferably 5 ppb or lower (e.g. 3 ppb or lower).

It is also possible to use a non-final stock polishing slurry $P_N$ wherein the concentrations of Cu and Ni are higher, respectively, than the concentrations of the same elements in the final stock polishing slurry $P_F$. The concentrations of Cu and Ni in the non-final stock polishing slurry $P_N$ can be individually, for instance, 1.2 times or higher, 1.5 times or higher, 2 times or higher, or even 5 times or higher than the concentrations of the same elements in the final stock polishing slurry $P_F$. The polishing method disclosed herein can be favorably practiced in an embodiment using such a non-final stock polishing slurry $P_N$ and can reduce PID at the end of final polishing.

While no particular limitations are imposed, it is also possible to use a non-final stock polishing slurry $P_N$ wherein at least the weight of Cu or the weight of Ni per 10 g of abrasive contained therein is greater than the weight of the same element per 10 g of abrasive in the final stock polishing slurry $P_F$. At least the weight of Cu or the weight of Ni per 10 g of abrasive in the non-final stock polishing slurry $P_N$ can be, for instance, 1.2 times or higher, 1.5 times or higher, 2 times or higher, or even 5 times or higher than the weight of the same element per 10 g of abrasive in the final stock polishing slurry $P_F$. According to the art disclosed herein, even with the use of the non-final stock polishing slurry $P_N$ in which the weights of Cu and Ni per 10 g of abrasive are mildly limited, PID upon final polishing can be effectively reduced.

For instance, in an embodiment where the stock polishing step includes several non-final stock polishing sub-steps that use several different non-final stock polishing slurries $P_N$ varying in weight of Cu per 10 g of abrasive, the weight of Cu per 10 g of abrasive in the final stock polishing slurry $P_F$ is compared to the weight of Cu per 10 g of abrasive in the non-final stock polishing slurry $P_N$ having the largest weight of Cu per 10 g of abrasive among them. The same applies to the weight of Ni per 10 g of abrasive and the combined weight of Cu and Ni per 10 g of abrasive.

In a preferable embodiment, it is possible to use a non-final stock polishing slurry $P_N$ having a larger combined weight of Cu and Ni per 10 g of abrasive than the combined weight of Cu and Ni per 10 g of abrasive in the final stock polishing slurry $P_F$. The combined weight of Cu and Ni per 10 g of abrasive in the non-final stock polishing slurry $P_N$ can be, for instance, 1.2 times or greater, 1.5 times or greater, 2 times or greater, or even 5 times or greater than the combined weight of Cu and Ni per 10 g of abrasive in the final stock polishing slurry $P_F$. The polishing method disclosed herein can be favorably practiced in an embodiment using such a non-final stock polishing slurry $P_N$ and can reduce PID at the end of final polishing. From the standpoint of preventing metal contamination of the silicon substrate, the combined weight of Cu and Ni per 10 g of abrasive in the non-final stock polishing slurry $P_N$ is preferably 10 µg or less, or more preferably 5 µg or less (e.g. 2 µg or less).

It is also possible to use a non-final stock polishing slurry $P_N$ wherein the weights of Cu and Ni per 10 g of abrasive in the non-final stock polishing slurry $P_N$ are greater, respectively, than the weights of the same elements per 10 g of abrasive in the final stock polishing slurry $P_F$. The weights of Cu and Ni per 10 g of abrasive in the non-final stock polishing slurry $P_N$ can be, for instance, 1.2 times or greater, 1.5 times or greater, 2 times or greater, or even 5 times or greater, respectively, than the weights of the same elements per 10 g of abrasive in the final stock polishing slurry $P_F$. The polishing method disclosed herein can be favorably practiced in an embodiment using such a non-final stock polishing slurry $P_N$ and can reduce PID upon final polishing.

In the art disclosed herein, the several stock polishing sub-steps (including the final stock polishing sub-step) carried out on the same platen can be two sub-steps, three sub-steps or more. From the standpoint of avoiding making the stock polishing step far too complicated, the number of stock polishing sub-steps is typically suitably 5 or fewer.

In the several stock polishing sub-steps, there are no particular limitations to the abrasive's BET diameter or concentration in the stock polishing slurry supplied to the polishing object in each stock sub-step, or to the polishing time in each polishing sub-step. In an embodiment, the several stock polishing sub-steps can be carried out so that the abrasive's BET diameter gradually decreases with respect to the stock polishing slurries supplied to the polishing object. This can efficiently reduce surface roughness Ra and cancel bumps in the stock polishing step.

In another embodiment, the several stock polishing sub-steps can be carried out so that the concentration of abrasive gradually decreases with respect to the stock polishing slurries supplied to the polishing object. This can efficiently reduce surface roughness Ra and cancel bumps in the stock polishing step.

In yet another embodiment, the several stock polishing sub-steps can be carried out while gradually reducing their polishing times. This can efficiently reduce surface roughness Ra and cancel bumps in the stock polishing step.

While no particular limitations are imposed, the total polishing time of the several stock polishing sub-steps can be, for instance, 60 minutes or less. From the standpoint of the productivity, it is preferably 50 minutes or less, or more preferably 40 minutes or less. On the other hand, from the standpoint of reducing surface roughness Ra and cancelling bumps in the stock polishing step, the total polishing time is usually suitably 5 minutes or more, or preferably 10 minutes or more (e.g. 15 minutes or more).

From the standpoint of preventing contamination of the silicon substrate in the stock polishing step, it is preferable to use a stock polishing slurry whose transition metal impurity content (when several transition metal impurities are contained, their combined amount; the same applies, hereinafter) per 10 g of abrasive (e.g. silica particles) is 10 mg or less (more preferably 5 mg or less). In particular, it is preferable that, in the final stock polishing slurry $P_F$, the transition metal impurity content per 10 g of abrasive is 0.1 mg or less (more preferably 0.01 mg or less). Examples of transition metal impurities possibly included in the stock polishing slurry include Cu and Ni as well as Ti (titanium), Fe (iron), Cr (chromium) and Ag (silver).

Besides the several stock polishing sub-steps carried out on the same platen, the stock polishing step may further include one, two or more stock polishing sub-steps carried out on a different platen (possibly of the same polishing machine or of a different polishing machine). In this case, the stock polishing sub-step(s) performed on the different platen(s) are preferably carried out before the several stock polishing sub-steps performed on the same platen.

(Rinse Solution)

After the final stock polishing sub-step, the polishing method disclosed herein may include a rinsing sub-step in which the polishing object is rinsed with an abrasive-free rinse solution. As the rinse solution, an aqueous solvent (e.g. water) can be used. In a rinse solution that can be used, a non-abrasive optional component is included in the aqueous solvent, the optional component being a species among components usable in the stock polishing slurry or the final polishing slurry described later. A favorable example of such a rinse solution includes a basic compound (e.g. ammonia) and a water-soluble polymer (e.g. a cellulose derivative such as hydroxyethyl cellulose) in an aqueous solvent (e.g. water). The rinse can be carried out on the same platen used in the final stock polishing sub-step.

From the standpoint of preventing local formation of $SiO_2$ upon the final stock polishing sub-step, in the rinse solution used, at least the Cu concentration or the Ni concentration is preferably 0.03 ppb or lower (more preferably 0.02 ppb or lower, e.g. 0.01 ppb or lower). The rinse solution preferably has a Cu/Ni combined concentration of 0.05 ppb or lower (more preferably 0.03 ppb or lower, e.g. 0.02 ppb or lower). In the rinse solution, the Cu concentration and the Ni concentration are individually preferably 0.03 ppb or lower (more preferably 0.02 ppb or lower, e.g. 0.01 ppb or lower).

From the standpoint of preventing local formation of $SiO_2$ upon the final stock polishing sub-step, in a preferable rinse solution, at least one and preferably each of the Cu concentration and the Ni concentration is more or less comparable to or lower (e.g. up to 0.8 times lower or up to 0.5 times lower) than the concentration of the same element in the final stock polishing slurry $P_F$. In a rinse solution, the Cu/Ni combined concentration is more or less comparable to or lower (e.g. up to 0.8 times lower or up to 0.5 times lower) than the combined Cu/Ni concentration in the final stock polishing slurry $P_F$.

The time for rinsing is not particularly limited. The rinsing time can be, for instance, 10 minutes or less; from the standpoint of the productivity, it is preferably 5 minutes or less, or more preferably 3 minutes or less, for instance, 2 minutes or less. From the standpoint of preventing an uneven rinsing, the rinsing time is typically suitably 15 seconds or more, or preferably 30 seconds or more, for instance 45 seconds or more.

<Final Polishing Step>

The polished object through the stock polishing step is further subjected to a final polishing step. The final polishing step is typically carried out while supplying a final polishing slurry to the polishing object, using a polishing machine different from the one used in the stock polishing step. The final polishing step may include several final polishing sub-steps carried out on one same platen or different platens.

The final polishing slurry used in the final polishing step typically comprises an abrasive and water. As the water, the same kinds as the water for the stock polishing slurry can be used.

(Abrasive)

As the abrasive for the final polishing slurry, similarly to the stock polishing slurry, silica particles can be preferably used. As the silica particles, colloidal silica is particularly preferable. For instance, colloidal silica prepared by ion exchange of liquid glass (sodium silicate) as the starting material can be preferably used. For the colloidal silica, solely one kind or a combination of two or more kinds can be used. The true specific gravity of silica particles, the outer shape and the average aspect ratio of the abrasive are comparable to those of the abrasive in the stock polishing slurry; and therefore, details are not repeated.

The BET diameter of the abrasive (typically silica particles) in the final polishing slurry is not particularly limited. From the standpoint of the efficiency of polishing, etc., the BET diameter is preferably 5 nm or greater, or more preferably 10 nm or greater. From the standpoint of obtaining greater polishing effect (e.g. reduction of haze, removal of defects, etc.), the BET diameter is 15 nm or greater, or more preferably 20 nm or greater (e.g. greater than 20 nm). From the standpoint of readily obtaining a highly smooth surface, the BET diameter of the abrasive is preferably 100 nm or less, more preferably 50 nm or less, or yet more preferably 40 nm or less. From the standpoint of readily obtaining a higher quality surface, it is also possible to use an abrasive having a BET diameter of 35 nm or less (typically less than 35 nm, preferably less than 32 nm, e.g. less than 30 nm).

The content of the abrasive in the final polishing slurry is not particularly limited. In an embodiment, the content of the abrasive is preferably 0.01% by weight or higher, more preferably 0.03% by weight or higher, or yet more preferably 0.05% by weight or higher, for instance, 0.08% by weight or higher. With increasing the content of the abrasive, greater polishing effect can be obtained. From the standpoint of the ease of removal from polished objects, the content of the abrasive in the final polishing slurry is usually suitably 7% by weight or lower, preferably 5% by weight or lower, more preferably 3% by weight or lower, or yet more preferably 2% by weight or lower, for instance, 1% by weight or lower.

(Basic Compound)

The final polishing slurry preferably comprises a basic compound. As the basic compound, one, two or more types can be used among the examples of the basic compound that can be used in the stock polishing slurry. Among them, ammonia is preferable.

(Water Soluble Polymer)

In a preferable embodiment, the final polishing slurry may comprise a water-soluble polymer. The type of water-soluble polymer is not particularly limited and a suitable type can be selected among water-soluble polymers known in the field of polishing slurry. For the water-soluble polymer, solely one type or a combination of two or more types can be used.

The water-soluble polymer may have at least one functional group in its molecule, selected among cationic groups, anionic groups and nonionic groups. In its molecule, the water-soluble polymer may have, for instance, a hydroxyl group, carboxy group, acyloxy group, sulfo group, primary amide structure, heterocyclic structure, vinyl structure, and polyoxyalkylene structure. From the standpoint of reducing aggregates and facilitating the cleaning, a nonionic polymer can be preferably used as the water-soluble polymer.

Examples of the water-soluble polymer include cellulose derivatives, starch derivatives, polymers containing oxyalkylene units, polymers containing nitrogen atoms, and polyvinyl alcohols. In particular, cellulose derivatives and starch derivatives are preferable. Cellulose derivatives are more preferable.

A cellulose derivative is a polymer that comprises β-glucose units as its primary repeat units. Specific examples of the cellulose derivative include hydroxyethyl cellulose (HEC), hydroxypropyl cellulose, hydroxyethyl methyl cellulose, hydroxypropyl methyl cellulose, methyl cellulose, ethyl cellulose, ethyl hydroxyethyl cellulose, and carboxymethyl cellulose. Among them, HEC is preferable.

A starch derivative is a polymer that comprises α-glucose units as its primary repeat units. Specific examples of the starch derivative include alpha starch, pullulan, carboxymethyl starch, and cyclodextrin. Among them, pullulan is preferable.

Examples of polymers containing oxyalkylene units include polyethylene oxide (PEO), block copolymers of ethylene oxide (EO) and propylene oxide (PO) or butylene oxide (BO), and random copolymers of EO and PO or BO. Among them, a block copolymer of EO and PO or a random copolymer of EO and PO are preferable. The block copolymer of EO and PO can be a diblock copolymer or a triblock copolymer comprising PEO blocks and polypropylene oxide (PPO) blocks, or the like. Examples of the tri-block copolymer include PEO-PPO-PEO triblock copolymer and PPO-PEO-PPO triblock copolymer. Typically, PEO-PPO-PEO triblock copolymer is more preferable.

In a block copolymer or random copolymer of EO and PO, from the standpoint of the water solubility and ease of cleaning, etc., the molar ratio (EO/PO) between EO and PO constituting the copolymer is preferably higher than 1, more preferably 2 or higher, or yet more preferably 3 or higher (e.g. 5 or higher).

As the nitrogen atom-containing polymer, either a polymer having a nitrogen atom in its main chain or a polymer having a nitrogen atom in a side-chain functional group (pendant group) can be used. Examples of the polymer having a nitrogen atom in the main chain include homopolymer and copolymer of an N-acylalkyleneimine-based monomer. Specific examples of the N-acylalkyleneimine-based monomer include N-acetyl ethyleneimine and N-propionyl ethyleneimine. Examples of the polymer having a nitrogen atom in a pendant group include a polymer having N-vinyl monomer units and the like. For example, homopolymer and copolymer of N-vinylpyrrolidone can be used.

When using a poly(vinyl alcohol) as the water-soluble polymer, the degree of saponification of the poly(vinyl alcohol) is not particularly limited.

In the art disclosed herein, the molecular weight of the water-soluble polymer is not particularly limited. The weight average molecular weight (Mw) of the water-soluble polymer can be, for instance, $200 \times 10^4$ or smaller; it is usually suitably $150 \times 10^4$ or smaller (typically $100 \times 10^4$ or smaller). From the standpoint of the stability of the dispersion, etc., the Mw is preferably $90 \times 10^4$ or smaller, more preferably $80 \times 10^4$ or smaller, or yet more preferably $60 \times 10^4$ or smaller. From the standpoint of enhancing the level of surface protection provided to the polished object, the Mw is suitably $1 \times 10^4$ or larger, more preferably $10 \times 10^4$ or larger, or yet more preferably $20 \times 10^4$ or larger. The Mw can be particularly preferably applied to cellulose derivatives (e.g. HEC).

The relation between the weight average molecular weight (Mw) and number average molecular weight (Mn) of the water-soluble polymer is not particularly limited. From the standpoint of preventing formation of aggregates, etc., for instance, the water-soluble polymer has a molecular weight distribution (Mw/Mn) of 10.0 or below, or more preferably 7.0 or below.

As the Mw and Mn of the water-soluble polymer, the values (aqueous, based on standard polyethylene oxide) based on aqueous gel permeation chromatography (GPC) can be used.

(Surfactant)

In a preferable embodiment, the final polishing slurry may comprise a surfactant (typically a water-soluble organic compound with Mw less than $1 \times 10^4$). The surfactant may contribute to enhance the stability of the polishing slurry or its concentrate. As the surfactant, anionic or nonionic type can be preferably used. From the standpoint of the low-foaming properties and the ease of pH adjustment, nonionic surfactants are more preferable. Examples include oxyalkylene polymers such as polyethylene glycol, polypropylene glycol, polytetramethylene glycol, etc.; polyoxyalkylene adducts such as polyoxyethylene alkyl ether, polyoxyethylene alkyl phenyl ether, polyoxyethylene alkylamine, polyoxyethylene fatty acid esters, polyoxyethylene glyceryl ether fatty acid esters, polyoxyethylene sorbitan fatty acid esters, etc.; copolymers (e.g. diblock copolymers, triblock copolymers, random copolymers, alternating copolymers) of several species of oxyalkylene. For the surfactant, solely one species or a combination of two or more species can be used.

The Mw of the surfactant is typically less than $1 \times 10^4$; from the standpoint of the filterability of the polishing slurry and the ease of cleaning the polished object, it is preferably 9500 or smaller. The Mw of the surfactant is typically 200 or larger; from the standpoint of haze-reducing effect, etc., it is preferably 250 or larger, or more preferably 300 or larger (e.g. 500 or larger). As the Mw of the surfactant, a value determined by GPC (aqueous, based on standard polyethylene glycol) or calculated from its chemical formula can be used. The art disclosed herein can be practiced in an embodiment using a final polishing slurry substantially free of surfactant as described above.

(Other Components)

As far as the effect of the present invention is not significantly impaired, the final polishing slurry may further include, as necessary, known additives such as a chelating agent, organic acid, organic acid salt, inorganic acid, inorganic acid salt, antiseptic agent and antifungal agent, which can be used in polishing slurries (typically, polishing slurries used in steps of polishing silicon substrates). As the chelating agent, the same kinds as the chelating agents usable in the stock polishing slurry can be used. The art disclosed herein can be practiced in an embodiment using a final polishing slurry substantially free of chelating agent.

From the standpoint of preventing contamination of the silicon substrate in the final polishing step, the amount of transition metal impurities per 10 g of abrasive (e.g. silica particles) in the final polishing slurry is preferably 0.1 mg or less (more preferably 0.01 mg or less). The final polishing slurry is preferably substantially free of oxidant, similarly to the stock polishing slurry.

<Polishing>

In the stock polishing step and the final polishing step, polishing can be carried out, for instance, in an embodiment including the following procedures.

In particular, a polishing slurry is obtained for use in each polishing step or each polishing sub-step. Subsequently, the polishing slurry (working slurry) is supplied to a polishing object and polishing is carried out by a conventional method. For instance, the polishing object is set in a polishing machine and via a polishing pad fixed to the platen (polishing platen) of the polishing machine, the polishing slurry is supplied to the surface of the polishing object (the surface to be polished). Typically, while the polishing slurry is continuously supplied, the polishing pad is pushed against the surface of the polishing object, and the two are moved (e.g. moved in circular motion) in coordination.

Each polishing slurry can be in a concentrate form before supplied to the polishing object, that is, a concentrated liquid form of the polishing slurry. The concentrated liquid can be thought as a stock solution of the polishing slurry. The polishing slurry in a concentrated form is advantageous from the standpoint of cost reduction and the convenience during its production, distribution, storage, etc. The concentration factor is not particularly limited. For instance, it can be about 2× to 100× by volume; it is usually suitably about 5× to 50× (e.g. about 10× to 40×).

Such a concentrate can be used in an embodiment where it is diluted whenever desired to prepare a polishing slurry (working slurry) and the resulting polishing slurry is supplied to a polishing object. It can be diluted by, for instance, adding water to the concentrate and mixing them.

The content of the abrasive in the concentrate can be, for instance, 50% by weight or lower. From the standpoint of the ease of handling the concentrate (e.g. the abrasive's dispersion stability and filterability), etc., the content of the abrasive in the concentrate is usually preferably 45% by weight or lower, or more preferably 40% by weight or lower. The content of the abrasive in the concentrate can be, for instance, 0.5% by weight or higher, preferably 1% by weight or higher, or more preferably 3% by weight or higher, for instance, 4% by weight or higher from the standpoint of cost reduction and the convenience during its production, distribution, storage and so on. In a preferable embodiment, the content of the abrasive in the concentrate can be 5% by weight or higher, 10% by weight or higher, 15% by weight or higher, 20% by weight or higher, or even 30% by weight or higher.

The polishing slurry in the art disclosed herein or its concentrate used may be a one-agent type or a multi-agent type such as a two-agent type. For example, it may be formulated so that part A comprising at least the abrasive among the components of the polishing slurry is mixed with part B comprising the remaining components and the mixture is diluted as necessary when desired to prepare the polishing slurry.

The method for preparing the polishing slurry or its concentrate is not particularly limited. For instance, the respective components of the polishing slurry or its concentrate can be mixed, using a known mixer such as a blade type stirrer, ultrasonic disperser and homomixer. The way of mixing these components is not particularly limited. For instance, all the components can be mixed at once or in a suitably selected order.

In each polishing step or each polishing sub-step, the polishing slurry can be used in an embodiment where it is disposed when used once in polishing (one-way) or it is used in recycle. One example of the method where the polishing slurry is used in recycle is a method where a tank collects a used portion of the polishing slurry released from a polishing machine and supplies the collected polishing slurry back to the polishing machine.

The polishing pad(s) used in each polishing platen are not particularly limited. For instance, any of the polyurethane foam type, non-woven fabric type, and suede type can be used. Each polishing pad may comprise abrasive particles or may be free of abrasives.

As the polishing machine, it is possible to use a double-sided polishing machine which polishes both sides of a polishing object at the same time or a single-sided polishing machine which polish only one side of a polishing object. While no particular limitations are imposed, for instance, a double-sided polishing machine (e.g. batch-type double-sided polishing machine) can be preferably used in the stock polishing step. A single-sided polishing machine can be preferably used in the final polishing step. Each polishing machine can be provided with one, two or more platens. Each polishing machine can be a single wafer polishing machine which is configured so as to polish a sheet of a polishing object at once, or a batch-type polishing machine which allows simultaneous polishing of several polishing objects on one same platen.

In a preferable embodiment, the polishing machine used in the stock polishing step is configured so that the polishing slurry supplied to the same platen can be switched to a different slurry in the middle of the step (typically when switching from one stock polishing sub-step to the next stock polishing sub-step in a series of stock polishing sub-steps carried out on the same platen). With the use of such a polishing machine, several stock polishing sub-steps can be favorably carried out on the same platen.

While no particular limitations are imposed, in the several stock polishing sub-steps carried out on the same platen, from the standpoint of the polishing efficiency, etc., the flow rate of polishing slurry supplied to the platen can be usually suitably 0.3 L/min or higher; it is preferably 0.5 L/min or higher, or more preferably 1 L/min or higher, for instance, 2 L/min or higher. From the standpoint of the cost-effectiveness and reducing environmental stress, etc., the flow rate of polishing slurry supplied to the platen is usually suitably 15 L/min or lower, or more preferably 10 L/min or lower (e.g. 7 L/min or lower).

In an embodiment, the flow rate can be preferably applied as a flow rate of polishing slurry per approximately 0.71 m$^2$ total area of the polishing surface. The flow rate of polishing slurry per approximately 0.71 m$^2$ total area of the polishing surface can be suitably increased or decreased in accordance with the total area of the surface that is actually polished so that the flow rate per total surface area is maintained more or less constant.

The values of aforementioned $W_{FCu}$, $W_{FNi}$, and $W_{FCu}-W_{FNi}$ can be preferably applied when, for instance, the total area of the polishing surface in the final stock polishing sub-step is about 0.71 m$^2$ (e.g. 0.2 m$^2$ up to 3.0 m$^2$, preferably 0.3 m$^2$ up to 1.0 m$^2$, or more preferably 0.5 m$^2$ up to 0.9 m$^2$). The values of $W_{FCu}$, $W_{FNi}$, and $W_{FCu}-W_{FNi}$ can be suitably increased or decreased in accordance with the total area of the surface that is actually polished so that their values per total surface area are maintained more or less constant.

While no particular limitations are imposed, the surface roughness (arithmetic average roughness (Ra)) of the silicon substrate before the stock polishing step can be, for instance, about 1 nm or greater and about 1000 nm or less, preferably about 10 nm or greater and about 100 nm or less. The surface roughness Ra of the silicon substrate after the stock polishing step can be, for instance, about 0.1 nm or greater and about 1 nm or less, or preferably about 0.2 nm or greater and about 0.5 nm or less. The surface roughness Ra of the silicon substrate can be determined, using, for instance, a laser-scanning surface roughness meter TMS-3000WRC available from Schmitt Measurement System Inc.

The polishing object after the stock polishing step is typically cleaned before the final polishing step is started. The cleaning can be carried out, using a suitable cleaning solution. The cleaning solution used is not particularly limited Usable examples include SC-1 cleaning solution (a mixture of ammonium hydroxide ($NH_4OH$), hydrogen peroxide ($H_2O_2$) and water ($H_2O$), SC-2 cleaning solution (a mixture of HCl, $H_2O_2$ and $H_2O$) and the like that are generally used in the field of semiconductors. The temperature of the cleaning solution can be, for instance, in a range between room temperature (typically about 15° C. to 25° C.) and about 90° C. From the standpoint of making the cleaning more effective, a cleaning solution at about 50° C. to 85° C. can be preferably used. The polished object at the end of the final polishing step can be cleaned in the same manner. The cleaning is typically carried out off the polishing machine used in the stock polishing step, that is, after the polished object is removed from the polishing machine.

According to the polishing method disclosed herein, via the stock polishing step and the final polishing step as described above, the polishing object (here, a silicon substrate, typically a monocrystalline silicon wafer) is completely polished. Thus, in another aspect of the art disclosed herein, a method for producing a polished object (a resultant of polishing) is provided, the method characterized by applying a polishing method disclosed herein to polish the polishing object.

<Polishing Composition Set>

The present application provides a polishing composition set that can be preferably used in the stock polishing step disclosed herein. The polishing composition set comprises at least a non-final stock polishing composition $Q_N$ and a final stock polishing composition $Q_F$ that are separately stored. The non-final stock polishing composition $Q_N$ can be a non-final stock polishing slurry $P_N$ used in a non-stock polishing sub-step or a concentrate thereof. The final stock polishing composition $Q_F$ can be a final stock polishing slurry $P_F$ used in the final stock polishing sub-step or a concentrate thereof. A stock polishing step disclosed herein and a polishing method including the stock polishing step can be favorably implemented, using such a polishing composition set. Thus, the polishing composition set can be preferably used in a stock polishing step disclosed herein, a polishing method including the stock polishing step and a polished object production method including the stock polishing step, a polished object production method including the polishing method, and so on. The polishing composition set may further comprise a final polishing composition. In the polishing composition set, the final polishing composition is stored separately from the non-final stock polishing composition $Q_N$ and the final stock polishing composition $Q_F$. The final polishing composition can be a final polishing slurry used in the final polishing step or a concentrate thereof. Each polishing composition forming the polishing composition set can be a single-agent type, or a multi-agent type such as a two-agent type. The multi-agent polishing composition can be configured so that, for instance, part A comprising at least the abrasive among the components of each polishing composition and part B comprising the remaining components are stored separately, part A and part B are mixed as necessary when desired, and the mixture is diluted to prepare a polishing composition or polishing slurry.

EXAMPLES

Several working examples relating to the present invention are described below although the present invention is not to be limited to such working examples.

1. Preparation of Polishing Slurry (Slurry A)

Were mixed a colloidal silica dispersion A, tetramethylammonium hydroxide (TMAH), potassium carbonate ($K_2CO_3$) and ion-exchanged water to prepare Slurry A containing 1.2% colloidal silica A (BET diameter: 50 nm), 0.05% TMAH and 0.03% $K_2CO_3$ by weight. Slurry A contained 0.17 ppb Cu and 0.027 ppb Ni, adding to 0.19 ppb Cu/Ni combined. The combined weight of Ni and Cu in Slurry A was 0.16 μg per 10 g of abrasive (colloidal silica A).

The BET diameter of colloidal silica A was determined by a surface area analyzer under trade name "FLOW SORB II 2300" available from Micromeritics (the same is true with colloidal silica B to D). The concentrations of Cu and Ni of Slurry A were determined from the results of analysis by inductively coupled plasma mass spectrometry (ICP-MS) (The same is true with Slurries B to D and the rinse solution).

(Slurry B)

In place of the colloidal silica dispersion A, a colloidal silica dispersion B was used. Otherwise in the same manner as the preparation of Slurry A, was prepared Slurry B containing colloidal silica B (BET diameter: 40 nm), TMAH and $K_2CO_3$. Slurry B contained 0.02 ppb Cu and 0.02 ppb Ni, adding to 0.04 ppb Cu/Ni combined. The combined weight of Ni and Cu was 0.033 μg per 10 g of abrasive (colloidal silica B).

(Slurry C)

In place of the colloidal silica dispersion A, a colloidal silica dispersion C was used. Otherwise in the same manner as the preparation of Slurry A, was prepared Slurry C containing colloidal silica C (BET diameter: 35 nm), TMAH and $K_2CO_3$. Slurry C contained 0.005 ppb Cu and 0.005 ppb Ni, adding to 0.01 ppb Cu/Ni combined. The combined weight of Ni and Cu was 0.008 μg per 10 g of abrasive (colloidal silica C).

(Slurry D)

In place of the colloidal silica dispersion A, a colloidal silica dispersion D was used. Otherwise in the same manner as the preparation of Slurry A, was prepared Slurry D containing colloidal silica D (BET diameter: 10 nm), TMAH and $K_2CO_3$. Slurry D contained 0.5 ppb Cu and 0.5 ppb Ni, adding to 1.0 ppb Cu/Ni combined. The combined weight of Ni and Cu was 0.83 μg per 10 g of abrasive (colloidal silica D).

(Rinse Solution)

Were mixed hydroxyethyl cellulose (HEC), ammonia water and ion-exchanged water to prepare a rinse solution containing 0.012% HEC and 0.03% ammonia by weight.

HEC used had a Mw of $50\times10^4$ by GPC (aqueous, based on standard polyethylene oxide). The rinse solution contained 0.005 ppb Cu and 0.005 ppb Ni, adding to 0.01 ppb Cu/Ni combined.

Slurries A to D individually contained about 0.003% ethylenediamine-tetrakis(methylenephosphonic acid) (EDTPO). Slurries A to D were prepared so that their pH values were in the range between 10 and 11.

2. Polishing Silicon Wafers

Example 1

(Stock Polishing Step)

Using Slurries A, B and C as polishing slurries (working slurries), the stock polishing step consisting of stock polishing sub-steps shown in Table 1 was carried out. In this example and Examples 2 to 7 below, the polishing objects (test pieces) were commercial monocrystalline silicon wafers of 300 mm diameter (785 μm thick, p-type conductivity, crystal orientation of <100>, 0.1 Ω·cm≤resistivity<100 Ω·cm) after lapped and etched. The wafers were engraved with backside hard laser marks based on SEMI M1(T7) standard. The wafers had surface roughness (arithmetic average roughness (Ra)) of about 50 nm, determined by a laser scanning surface roughness meter TMS-3000WRC available from Schmitt Measurement System Inc.

Specifically, the stock polishing step was carried out as follows: Five test pieces (total surface area polished: about 0.71 m²) were set in the double-sided polishing machine shown below. While supplying Slurry A, the first stock polishing sub-step was started. At 15 minutes after the start of the first stock polishing sub-step, the slurry was switched to Slurry B and the second stock polishing sub-step was started. At 5 minutes after the start of the second stock polishing sub-step, the slurry was switched to Slurry C and the third stock polishing sub-step (the final stock polishing sub-step in this Example) was started. At 3 minutes after the start of the third stock polishing sub-step, the supply of Slurry C and the operation of the double-sided polishing machine were stopped.

[Stock Polishing Conditions]

Polishing machine: double-sided polishing machine, model number DSM20B-5P-4D available from SpeedFam Co., Ltd.
Polishing pressure: 150 g/cm²
Relative top platen rotational speed: 20 rpm
Relative bottom platen rotational speed: −20 rpm
Polishing pads: product name MH S-15A available from Nitta Haas Inc.
Flow rate: 4 L/min (one-way)
Temperature maintained in polishing environment: 23° C.
Polishing time: as shown in Table 1

(Cleaning)

The stock-polished test pieces were removed from the polishing machine and cleaned (SC-1 rinsed) with a cleaning solution at NH$_4$OH (29%)/H$_2$O$_2$ (31%)/deionized water (DIW)=1/3/30 (volume ratio). More specifically, two cleaning baths each attached with an ultrasonic wave oscillator of 950 kHz frequency were obtained; the cleaning solution was placed in each of the first and second cleaning baths and maintained at 60° C.; and the stock-polished test pieces were immersed in the first cleaning bath for 6 minutes and then, via a ultrasonic rinsing bath with ultrapure water, in the second cleaning bath for 6 minutes, with the respective ultrasonic wave oscillators turned on.

(Final Polishing Step)

The rinsed test pieces were set in the single-sided polishing machine shown below. Using a final polishing slurry, the polishing step was carried out under the conditions shown below. As the final polishing slurry, was used product name GLANZOX 3108 available from Fujimi Inc. diluted by 20 times with ion-exchanged water. The final polishing slurry contained 0.45% silica particles by weight, 0.005 ppb Cu or less and 0.005 ppb Ni or less.

[Final Polishing Conditions]

Polishing machine: Single-sided single wafer polishing machine, model number PNX-332B available from Okamoto Machine Tool Works, Ltd.
Polishing pressure: 150 g/cm²
Platen rotational speed: 30 rpm
Head rotational speed: 30 rpm
Polishing pad: trade name POLYPAS 27NX available from Fujibo Ehime Co., Ltd.
Flow rate: 1 L/min (drained as used)
Temperature maintained in polishing environment: 20° C.
Polishing time: 5 min Upon completion of the final polishing, the test pieces were removed from the polishing machine and rinsed in the same manner as the rinse after the stock polishing. Final-polished silicon waters according to Example 1 were thus obtained.

Examples 2 to 7

The details (specifics of stock polishing sub-steps) of the stock polishing step were changed as shown in Table 1. Otherwise in the same manner as Example 1, were obtained final-polished silicon wafers according to Examples 2 to 7.

3. Evaluations

<Assessment of Number of PID>

With respect to the final-polished silicon wafers of Examples 1 to 7, the number of PID was assessed as follows: Using a wafer defect tester under trade name MAGICS M5350 available from Lasertec Corporation, the entire surface of each wafer (excluding 5 mm outer peripheral portion) was inspected and the number of defects detected as linear bump were counted as the number of PID. The resulting number of PID was converted to the relative value with the number of PID of Example 6 being 100% and graded into the four grades shown below. The results are shown in the "PID" column of Table 1.
A+: <35%
A: >35%, <70%
B: >70%, <100%
C: >100%

<Surface Roughness Ra>

With respect to the stock-polished silicon wafers (test pieces after the stock polishing step and the subsequent rinse) of Examples 1 to 7, using model number TMS-3000-WRC available from Schmitt Measurement Systems Inc., their surface roughness Ra (arithmetic average surface roughness) was determined. The measurement values obtained were converted to relative values with the surface roughness Ra of Example 6 being 100% and graded into the three grades shown below. The results are shown in the "Ra" column of Table 1.
A: <90%
B: >90%, <100%
C: >100%

<HLM-Cancellation Abilities>

With respect to the stock-polished silicon wafers, using HRP340 available from KLA-Tencor, the surface roughness Rt of HLM (hard laser mark)-containing areas in a 1 mm by 5 mm field of view was determined to evaluate their HLM-cancellation abilities. Here, the surface roughness Rt is a parameter indicating the maximum cross-sectional height of a roughness curve, showing the difference between the highest point and the lowest point of the wafer surface in an area in a constant field of view (here, a HLM-containing area in the 1 mm by 5 mm field of view). The measurement values obtained were graded into the three grades shown below. The results are shown in the "HLM" column of Table 1.
A: <50 nm
B: >50 nm, <70 nm
C: >70 nm

TABLE 1

|  |  | Stock polishing sub-steps | | | Evaluations | | |
|---|---|---|---|---|---|---|---|
|  |  | 1 | 2 | 3 | PID | Ra | HLM |
| Ex. 1 | Supplied liquid | Slurry A | Slurry B | Slurry C | A+ | A | A |
|  | Polishing time | 15 min | 5 min | 3 min |  |  |  |
|  | Amount    Cu | 10 | 0.4 | 0.06 |  |  |  |
|  | supplied  Ni | 2 | 0.4 | 0.06 |  |  |  |
|  | (μg)  Cu + Ni | 12 | 0.8 | 0.12 |  |  |  |
| Ex. 2 | Supplied liquid | Slurry A | Slurry C | N/A | A | A | A |
|  | Polishing time | 20 min | 3 min |  |  |  |  |
|  | Amount    Cu | 13 | 0.06 |  |  |  |  |
|  | supplied  Ni | 2 | 0.06 |  |  |  |  |
|  | (μg)  Cu + Ni | 15 | 0.12 |  |  |  |  |
| Ex. 3 | Supplied liquid | Slurry A | Slurry C | (Rinse) | A | A | A |
|  | Polishing time | 20 min | 3 min | (1 min) |  |  |  |
|  | Amount    Cu | 13 | 0.06 | (0.02) |  |  |  |
|  | supplied  Ni | 2 | 0.06 | (0.02) |  |  |  |
|  | (μg)  Cu + Ni | 15 | 0.12 | (0.04) |  |  |  |
| Ex. 4 | Supplied liquid | Slurry D | Slurry A | Slurry C | A | A | B |
|  | Polishing time | 15 min | 5 min | 3 min |  |  |  |
|  | Amount    Cu | 30 | 3.33 | 0.06 |  |  |  |
|  | supplied  Ni | 30 | 0.53 | 0.06 |  |  |  |
|  | (μg)  Cu + Ni | 60 | 3.87 | 0.12 |  |  |  |
| Ex. 5 | Supplied liquid | Slurry A | Slurry B | N/A | B | B | A |
|  | Polishing time | 15 min | 5 min |  |  |  |  |
|  | Amount    Cu | 10 | 0.4 |  |  |  |  |
|  | supplied  Ni | 2 | 0.4 |  |  |  |  |
|  | (μg)  Cu + Ni | 12 | 0.8 |  |  |  |  |
| Ex. 6 | Supplied liquid | Slurry A | N/A | N/A | C | B | A |
|  | Polishing time | 20 min |  |  |  |  |  |
|  | Amount    Cu | 13 |  |  |  |  |  |
|  | supplied  Ni | 2 |  |  |  |  |  |
|  | (μg)  Cu + Ni | 15 |  |  |  |  |  |
| Ex. 7 | Supplied liquid | Slurry A | Slurry C | Slurry D | C | A | A |
|  | Polishing time | 20 min | 3 min | 1 min |  |  |  |
|  | Amount    Cu | 13 | 0.06 | 2 |  |  |  |
|  | supplied  Ni | 2 | 0.06 | 2 |  |  |  |
|  | (μg)  Cu + Ni | 15 | 0.12 | 4 |  |  |  |

As shown in Table 1, as compared to Examples 6 and 7, PID was greatly reduced upon final polishing in Examples 1 to 5 where several stock polishing sub-steps were carried out so as to reduce the amounts of Cu and Ni supplied to the polishing objects during the final stock polishing sub-step.

Although specific embodiments of the present invention have been described in detail above, these are merely for illustrations and do not limit the scope of the claims. The art according to the claims includes various modifications and changes made to the specific embodiments illustrated above.

The invention claimed is:
1. A method for polishing a silicon substrate, the method comprising
a stock polishing step and a final polishing step, wherein:
the stock polishing step comprises several stock polishing sub-steps that are carried out on one same platen;
the several stock polishing sub-steps comprise a final stock polishing sub-step that is carried out while supplying a final stock polishing slurry $P_F$ to the silicon substrate;
the total amount of the final stock polishing slurry $P_F$ supplied to the silicon substrate during the final stock polishing sub-step has a total weight of Cu and a total weight of Ni, at least one of which being 1 μg or less;
the several stock polishing sub-steps are carried out wherein a time for each stock polishing sub-step is reduced to a time shorter than its preceding step; and
both sides of the silicon substrate are polished simultaneously in each of the several stock polishing sub-steps and one side of the silicon substrate is polished in the final polishing step.

2. The polishing method according to claim 1, wherein, in the final stock polishing sub-step, the total weight of Cu and the total weight of Ni in the total amount of the final stock polishing slurry $P_F$ supplied to the silicon substrate add to a total of 2 μg or less.

3. A method for polishing a silicon substrate, the method comprising a stock polishing step and a final polishing step, wherein:
the stock polishing step comprises several stock polishing sub-steps that are carried out on one same platen;
the several stock polishing sub-steps comprise:
a final stock polishing sub-step that is carried out while supplying a final stock polishing slurry $P_F$ to the silicon substrate; and
a non-final stock polishing sub-step that is carried out before the final stock polishing sub-step while supplying a non-final stock polishing slurry $P_N$ having a higher concentration of at least Cu or Ni than the concentration of the same element in the final stock polishing slurry $P_F$;
the several stock polishing sub-steps are carried out wherein a time for each stock polishing sub-step is reduced to a time shorter than its preceding step;
both sides of the silicon substrate are polished simultaneously in each of the several stock polishing sub-steps and one side of the silicon substrate is polished in the final polishing step.

4. The polishing method according to claim 3, wherein the non-final stock polishing slurry $P_N$ has a weight of at least Cu or Ni per 10 g of abrasive contained therein greater than the weight of the same element per 10 g of abrasive contained in the final stock polishing slurry $P_F$.

5. The polishing method according to claim 3, wherein the final stock polishing slurry $P_F$ has a weight of at least Cu or Ni of 0.02 μg or less per 10 g of abrasive contained in the final stock polishing slurry $P_F$.

6. The polishing method according to claim 3, wherein the final stock polishing slurry $P_F$ has a combined weight of Cu and Ni of 0.1 μg or less per 10 g of abrasive contained in the final stock polishing slurry $P_F$.

7. The polishing method according to claim 3, wherein the non-final stock polishing slurry $P_N$ has a combined weight of Cu and Ni per 10 g of abrasive contained therein greater than the combined weight of Cu and Ni per 10 g of the abrasive contained in the final stock polishing slurry $P_F$.

8. The polishing method according to claim 3, wherein the stock polishing step is carried out on a silicon substrate provided with a hard laser mark.

9. A method for polishing a silicon substrate, the method comprising
a stock polishing step and a final polishing step, wherein:
the stock polishing step comprises several stock polishing sub-steps that are carried out on one same platen;
the several stock polishing sub-steps comprise:
- a final stock polishing sub-step that is carried out while supplying a final stock polishing slurry $P_F$ to the silicon substrate; and
- a non-final stock polishing sub-step that is carried out before the final stock polishing sub-step while supplying a non-final stock polishing slurry $P_N$ having a higher concentration of at least Cu or Ni than the concentration of the same element in the final stock polishing slurry $P_F$; and both sides of the silicon substrate are polished simultaneously in each of the several stock polishing sub-steps and one side of the silicon substrate is polished in the final polishing step.

\* \* \* \* \*